United States Patent [19]

Maerfeld et al.

[11] 4,323,985
[45] Apr. 6, 1982

[54] TWO DIMENSIONAL ACOUSTO-ELECTRICAL DEVICE FOR STORING AND PROCESSING INFORMATION

[75] Inventors: Charles Maerfeld; Herve Gautier, both of Paris, France

[73] Assignee: Thomson-CSF, Paris, France

[21] Appl. No.: 116,477

[22] Filed: Jan. 29, 1980

[30] Foreign Application Priority Data

Feb. 2, 1979 [FR] France ............................ 79 02766

[51] Int. Cl.³ ............................................. G11C 13/00
[52] U.S. Cl. ..................................... 365/157; 365/189
[58] Field of Search ................................ 365/157, 189

[56] References Cited

U.S. PATENT DOCUMENTS

| | | | |
|---|---|---|---|
| 3,357,001 | 12/1967 | Smith | 365/157 |
| 3,890,604 | 6/1975 | Schroder | 365/157 |
| 3,921,154 | 11/1975 | Barkley | 365/157 |

Primary Examiner—Terrell W. Fears
Attorney, Agent, or Firm—Roland Plottel

[57] ABSTRACT

An acousto-electrical device for storing and processing information, in analog form, at any point of a two dimensional surface. It comprises: a piezoelectric substrate carrying four electro-mechanical transducers emitting elastic surface waves in two normal directions; a semi-conductor substrate carrying a diode network placed facing the piezoelectric substrate, and two electrodes placed respectively on the end faces of the two substrates. In one embodiment, the storing of a signal applied between the electrodes is achieved by means of two elastic auxiliary addressing waves, the non linear interaction of these three signals supplying a spatially periodic signal independent of time which is stored by the diodes. The stored signal is subsequently processed by means of elastic reading waves which interact non linearly therewith to provide simple reading of the initial signal or processing thereof, in particular its Fourier transform.

19 Claims, 3 Drawing Figures

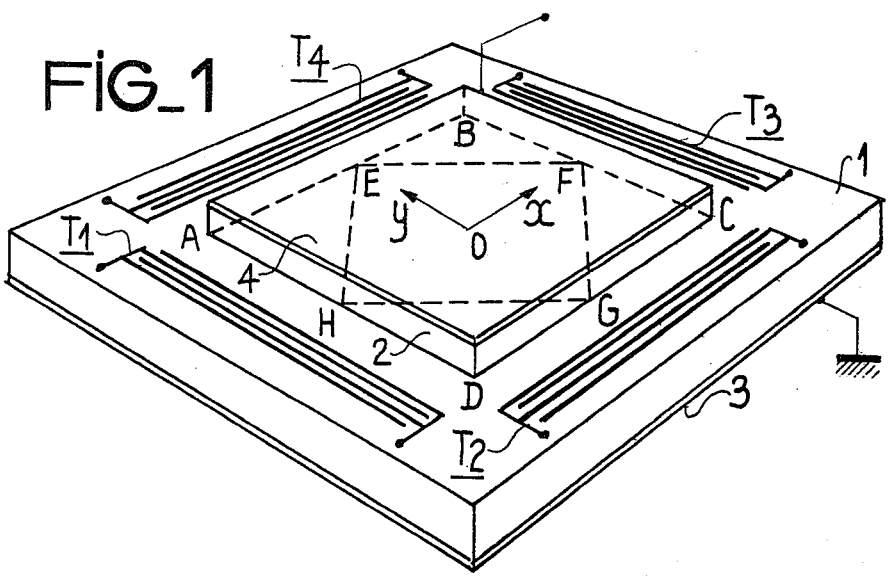
FIG_1
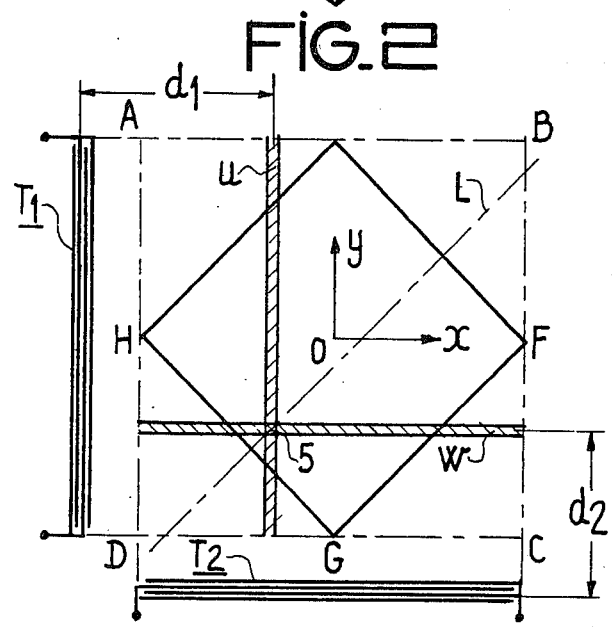
FIG.2
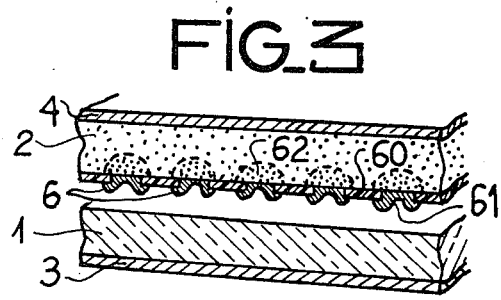
FIG.3

1

TWO DIMENSIONAL ACOUSTO-ELECTRICAL DEVICE FOR STORING AND PROCESSING INFORMATION

BACKGROUND OF THE INVENTION

The present invention relates to an acousto-electrical device capable of storing information in analog form, at any point of a surface, and of processing this information in different ways, such as Fourier's transformation for example.

Different acousto-electrical devices have already been used for storing and processing information. They are generally formed by a piezoelectric substrate and a semi-conductor substrate placed face to face; acoustic waves, also called elastic waves, are generated at the surface of the piezoelectric substrate; their interactions create spatially differentiated areas which represent them and which are stored in the semi-conductor substrate. Other acoustic waves are subsequently generated at the surface of the piezoelectric substrate and interact with the stored information, thus achieving processing of the information borne by the elastic waves, such as correlation or convolution. Such a device is for example described in French Pat. No. 73-45234 in the name of Thomson-CSF (publication no.: 2 254 908).

However, the storing and the processing are effected in these devices only in one dimension.

The present invention provides a device for storing analog information at any but distinct points of a two-dimensional surface, and for processing this information, which has the evident advantages of compactness of the device, as well as simplification in carrying out certain types of processing, which will be described below.

SUMMARY OF THE INVENTION

To this end, the device according to the invention comprises:

a first medium, piezoelectric, carrying two, three or four electro-mechanical transducers generating elastic waves at the surface of the piezoelectric medium;

a second medium, electrically non-linear such as a semi-conductor substrate, in which non-linear interactions are apt to occur between the electric fields associated with the elastic waves propagated on the piezoelectric medium;

a third medium, for storing quantities of charges, electrically coupled to the non-linear medium, formed for example by a capacitor network.

The storing of signal S(t) is carried out by means of two auxiliary addressing signals, two at least of these three signals being applied to the transductors so as to be transformed into elastic waves, the frequencies of the auxiliary signals being such that the non-linear interaction of the three signals supplies a time independant signal, which is stored in the third medium.

The signal thus stored is subsequently processed by means of two, three or four auxiliary reading signals which, depending on their frequency, their form and their propagating direction, provide processing of signal S(t) particularly by correlation, convolution or Fourier's transform.

The above and other objects, features and advantages of the present invention will become apparent from the following description, given solely by way of non-limiting illustration, when taken in conjunction with the accompanying drawings.

DESCRIPTION OF THE DRAWINGS

FIG. 1 shows one embodiment of the device of the invention.

FIG. 2 is a diagram for explaining the operation of a device of the invention.

FIG. 3 shows a fractional sectional view of another embodiment of FIG. 1.

DESCRIPTION OF THE PREFERRED EMBODIMENTS

FIG. 1 comprises:

a piezoelectric substrate 1, for example in the form of a rectangular plate;

four electro-mechanical transducers: $T_1$, $T_2$, $T_3$ and $T_4$, capable of generating when electrically energized elastic waves at the surface of substrate 1 and conversely, and that in two separate directions Ox and Oy which are, in the example of the figure, perpendicular to each other. The transducers are for example each formed in a conventional way by two electrodes in the form of interdigited combs, the waves being emitted in the direction which is normal to the teeth of the combs. In the figure, transducers $T_1$ and $T_3$ generate waves respectively along $+\overrightarrow{Ox}$ and $-\overrightarrow{Ox}$ and transducers $T_2$ and $T_4$ along $+\overrightarrow{Oy}$ and $-\overrightarrow{Oy}$. The zone ABCD of intersection of the elastic waves is called interaction surface. If the transducers are of the same length and are placed two by two facing each other, ABCD is as shown in the figure a square whose side is equal to the length of the transducers;

a so-called non-linear medium in which non-linear interactions are likely to occur between the signals applied to the device, the amplitude of these interactions depending on the concentration of the electrical charges in this medium. This medium is either continuous and homogeneous or formed from discrete elements such as diodes. In the first case it is preferably semi-conductor, for example made from silicon. In the embodiment shown in the figure this semi-conductor medium is in the form of a wafer 2 placed facing substrate 1, on the same side as the transducers and along interaction surface ABCD, wafer 2 is separated from substrate 1 by a thin layer of air;

means for storing quantities of charges, electrically coupled to the non-linear medium. These means are formed either by a continuous medium, such as a semi-conductor substrate in which there exist surface or volume traps for the charge carriers, or by a network of discrete storage elements, such as a capacity network provided in semi-conductor medium 2. These means are not shown in FIG. 1, but are described in more detail hereafter;

means for picking or applying electrical signals, produced by the device or applied thereto. These means may be formed simply by a continuous so-called ground electrode 3 connected to the reference potential of the device, covering the surface of substrate 1 opposite that which carries the transducers, and a so-called signal electrode 4 having a continuous or periodic structure, placed on the surface of substrate 2 which is opposite the interaction surface.

Furthermore, different variations, not shown, are possible for obtaining the semi-conductor and piezo-electric substrates: it is possible to merge the two mediums into a single substrate, made of cadmium sulfide (CdS) or gallium arsenside (GaAs) for example, or else to form the piezoelectric medium from a thin layer, i.e. whose thickness is of the order of a fraction of the elastic wavelength deposited on a semi-conductor material plate.

To store a signal in the device of FIG. 1, two auxiliary writing signals are used in the following way.

We will assume that signal S(t) to be stored is of a duration less than the time taken by an elastic wave to travel over the interaction surface and that it is carried by a pulse wave $\omega_s$, and that the two writing signals, U(t) and W(t), are respectively pulse waves $\omega_u$ and $\omega_w$.

Signal U(t) is for example applied to transductor $T_1$, signal W(t) to transductor $T_2$ and signal S(t) between the two electrodes 3 and 4. The waves emitted may be written as follows:

for $T_1$: $U(t) \cos(\omega_u t - \vec{k_u} \cdot \vec{r})$ for $T_2$: $W(t) \cos(\omega_w t - \vec{k_w} \cdot \vec{r})$ for electrodes 3 and 4: $S(t) \cos(\omega_s t - \vec{k_s} \cdot \vec{r})$ with the following remarks:
$\vec{k_u}$ and $\vec{k_w}$ are wave vectors corresponding to the waves generated; $\vec{k_s}$ is not a true wave vector, but a vector perpendicular to electrodes 3 and 4, of module $(2\pi/p)$ in the case where electrode 3 is a periodic network with pitch p; in the case where electrode 3 is continuous, $|\vec{k_s}| = 0$
$\vec{r}$ determines the point of coordinates (x,y)
the origin of the times and the coordinates is point 0, situated in the middle of the interaction zone.

Because of the piezoelectric nature of substrate 1, a potential is associated with the surface elastic waves; there then exists, at the moment when these three waves interact, in the non-linear medium 2, the following potential:

$$V = U\cos(\omega_u t - \vec{k_u} \vec{r}) + W\cos(\omega_w t - \vec{k_w} \vec{r}) \quad (1)$$
$$S\cos(\omega_s t - \vec{k_s} \vec{r})$$

Medium 2 is electrically non-linear, i.e. the characteristic $I_s = f(V_s)$ between the potential $(V_s)$ applied to the surface of medium 2 and the current $(I_s)$ normal to its surface, is not linear but has the form:

$$I_s = Y_{sc}V_s + \frac{\partial Y_{sc}}{\partial V_s} \cdot V_s^2 + \frac{\partial^2 Y_{sc}}{\partial V_s^2} \cdot V_s^3 + \ldots \quad (2)$$

$$= i_L + i_{NL2} + i_{NL3} + \ldots$$

where $Y_{sc}$ is the surface admittance of semi-conductor 2, per unit of surface, and $(\partial Y_{sc}/\partial V_s)$ and $(\partial^2 Y_{sc}/\partial V_s 2)$ translate the modification of this admittance as a function of the biassing potential $V_s$. The currents $i_L$, $i_{NL2}$, $i_{NL3}$ are the resulting currents, respectively linear, non-linear of order 2 and non-linear of order 3.

By way of example, the non-linear medium may be an homogeneous semi-conductor substrate: in fact, it is known that there exists at the surface of the semi-conductor an electron enhanced or depleted zone in relation to the rest of the volume of this semi-conductor. The result is a surface capacity whose value may be, according to well-known theories (varicap effect), modified by the existence of a surface potential. This potential may for example be created by an elastic wave moving at the surface of a piezoelectric medium close to the semi-conductor medium. There then occurs storage of this potential representing the elastic wave.

As non-linear medium, it is also possible to use a matrix of discrete elements, each of which has a diode type characteristic, i.e. the current which passes therethrough in the forward direction is appreciably greater than the current which passes therethrough in the reverse direction. The surface of the semi-conductor medium which is facing the interaction surface carries in this case for example a diode network. The potential associated with the elastic waves propagated at the surface of the piezoelectric medium then biasses these diodes and, at each half-wave in which the diodes are forwardly biassed, there flows in the semi-conductor a current normal to the surface thereof. On the other hand, no current flows in the other half-waves. The result is a movement of charges per period creating a potential which is opposite the biassing potential: the current stops when the potential which is induced is equal and opposite the maximum of the biassing potential. This operation is that of a peak detector. It should be noted that correct operation requires a number of diodes such that their spacing is less than half an elastic wavelength.

The operating modes described above comprise a storage function and therefore enable, in a single medium, the storage means and the non-linear medium mentioned above to be obtained. However, it is the second mode of operation which gives the best storage effects, and it is to that which the following description refers. By way of example, this embodiment is illustrated in FIG. 3. Nevertheless, the device of the invention may use one or other of the types of non-linear medium.

FIG. 3 shows then a partial sectional view of a variation of the device of the invention, in which a diode network is used as non-linear medium and storage means.

In this figure, there may be distinguished on the one hand the piezoelectric substrate 1 and ground electrode 3 and, on the other hand, the semi-conductor substrate 2 and signal electrode 4. The surface of semi-conductor 2 which is facing substrate 1 carries a network of diodes bearing the general reference 6.

Each of diodes 6 comprises a zone 62, formed in substrate 2 having a type of conductivity opposite that of the substrate; substrate 2 is covered by an insulating layer 60 interrupted above zone 62; diode 6 is terminated by a conducting stud 61 disposed in holes provided in layer 60.

The PN type diodes described above may of course be replaced by other electrically non-linear semi-conductor elements, as another type of diode, or else by MOS or MIS elements.

Furthermore, so as to improve the storage effect, it is possible to provide capacitances in the semi-conductor substrate 2 and, in the case where the non-linear medium is formed by a diode network, to connect the capacitances in parallel respectively across each of the diodes.

Thus, as has been described above, the device of the invention uses two auxiliary addressing signals U(t) and W(t). To generalize formula (1), the transducer which generated signals U, W or S is no longer provided by conjecture: this transducer may be any one of the electro-mechanical transducers $T_1$ or $T_2$ or the pair of electrodes 3 and 4.

The non-linear interaction of these three signals supplies signals characterized by their resulting angular frequency $\Omega$ and their wave vector K. It is shown that one of them, called here $S_M$, is independent of time (i.e. its angular frequency $\Omega_M$ is zero) and may be used for storing signal S(t).

So we have $\Omega_M = 0 = \epsilon_u \cdot \omega_u + \epsilon_w \cdot \omega_w + \epsilon_s \cdot \omega_s$ with $\epsilon_u = \mp 1$, $\epsilon_w = \mp 1$, $\epsilon_s = \mp 1$, which is more simply written: $\epsilon_u \cdot \omega_u + \epsilon_w \cdot \omega_w = \omega_s$. Assuming furthermore U>S and W>S, we have: $V_{MAX} = U + W + S \cos[(\epsilon_u \vec{k}_u + \epsilon_w \vec{k}_w + \epsilon_s \vec{k}_s) \cdot \vec{r}]$ (3), i.e. that signal S is frozen independently of time with a spatial periodicity K:

$$\vec{K} = \epsilon_u \vec{k}_u + \epsilon_w \vec{k}_w + \epsilon_s \vec{k}_s \text{ or else } \vec{K} = \epsilon_u \vec{k}_u + \epsilon_w \vec{k}_w - \vec{k}_s.$$

If $\omega_u$ is not substantially different from $\omega_w$, the condition connecting the angular frequencies is simplified as:

$$\omega_s = \omega_u \pm \omega_w \quad (4)$$

and the relation connecting the wave vectors, as:

$$\vec{K} = \pm(\vec{k}_u \pm \vec{k}_w - \vec{k}_s) \quad (5)$$

Formulae (4) and (5) constitute selection rules tying together signals S(t), U(t) and W(t), and more precisely tying their frequencies to their modes of application (electrodes 3-4 or transducers $T_1 \ldots T_4$).

It should however be remarked that $\omega_u$ and $\omega_w$ must preferably not be close to one another so as to prevent U and W beating giving rise to a network which is superimposed on the network of period K.

Furthermore, we have assumed a peak detector type operation; non-linear behavior of the first type described leads to a very similar result, only the amplitude of the stored signals being different.

In practice, in a first embodiment of the device of the invention, two auxiliary writing signals U(t) and W(t) having a pulsatory form are used for storing signal S(t).

They are for example the following:

$U \cdot \delta(t) \cdot e^{i\omega_u t}$ applied to transducer $T_1$, then emitted along Ox, $W \cdot \delta(t - \tau) \cdot e^{i\omega_w t}$ applied to transducer $T_2$, then emitted along Oy, $S(t) \cdot e^{i\omega_s t}$ applied to electrodes 3 and 4, $\delta$ being the DIRAC function.

At a given time t, only one coordinate point M:

$$\begin{cases} x = v_x \cdot t \\ y = v_y \cdot t - v_y \cdot \tau \end{cases}$$

sees the simultaneous presence of three waves. At this point, the charges q (x,y) of the non-linear elements are given by formula (3) and we have:

$$q(x,y) \alpha\ U + W + S\left(-\frac{x}{v_x}\right) \cdot \cos \vec{K} \cdot \vec{r}$$

When t varies, point M describes a straight line L of equation:

$$y = \frac{v_y}{v_x} \cdot x - v_y \tau$$

on which the charge Q(x) is equal to:

$$Q(x) \alpha\ U + W + S\left(-\frac{x}{v_x}\right) \cdot \cos \vec{K} \cdot \vec{r} \quad (6)$$

Outside this straight line L, the charge is equal to the maximum amplitude of the signals which have flowed, i.e. the largest of signals U or W, since we have $$\begin{cases} U > S \\ W > S \end{cases}$$

To write a second line, again two pulsatory waves are used but for which the delay of a second in relation to the first one is now equal to $\tau'$: the signal $U \cdot \delta(t) \cdot e^{i\omega_u t}$ is applied to transducer $T_1$ and $W \cdot \delta(t - \tau') \cdot e^{i\omega_w t}$ to transducer $T_2$, a signal S'(t) to be stored being applied to electrodes 3 and 4 at the frequency $\omega_s$ as previously.

Similarly to what has already been described, a single point M' sees the simultaneous presence of the three waves, this point M' describing a straight line L' parallel to the preceding one and of equation:

$$y - \frac{v_y}{v_x} \cdot x - v_y \cdot \tau'$$

On this straight line L' the charge is equal to the maximum of the signals U(t), W(t) and S', i.e. similarly to line L (equation 6):

$$Q(x) \alpha\ U + W + S'\left(-\frac{x}{v_x}\right) \cos \vec{K} \cdot \vec{r}$$

This storage in parallel lines is illustratd in FIG. 2.

In FIG. 2 there are only shown the plane XOY and the two transducers $T_1$ and $T_2$ which generate the pulses, as well as interaction surface ABCD. There is shown at a given time t the position of the elastic waves by means of hatched strips U and W, for the sake of simplication: pulse U is parallel to $T_1$ at a distance $d_1$ equal to $v_x t$ from this latter and pulse W is parallel to $T_2$ at a distance $d_2$ equal to $v_y(t - \tau)$ from this latter.

The zone 5 of intersection of these two zones forms the preceding "point" M. When the two pulses U and W are propagated, their intersection 5 describes a straight line L. The angle which this straight line L forms with OX depends only on the directions of emission and the velocities of waves U and W. If, as shown in the figure, U is emitted along Ox and W along Oy and if $v_x = v_y$, the straight line L forms an angle of $\pi/4$ with Ox. Furthermore, since the position of line L in plane XOY depends on the delay $\tau$ of W in relation to U, it can be seen that it is possible as previously shown by calculation to scan a surface such as ABCD by means of a frame of N lines parallel to the straight line L, by emitting N pairs of pulses (U,W) with N different values of their relative delay $\tau$.

It is to be noted that with the writing process employed, the inscription of a line does not erase the inscription of the preceding lines: in fact, there is only coincidence of the three signals U, W and S on the line (for example L') whose inscription is in progress. Over the rest of the surface, the maximum existing potential is equal to the largest of the signals U or W and so less than the potential of the line previously written where it will therefore not be taken into account. Conversely, the inscription of the largest of the signals U or W over the whole of the interaction surface during the inscription of line L does not prevent line L' from being written on this same surface, this latter being characterized by a potential greater than that previously existing therein.

With the device of FIG. 1 comprising five inputs, i.e. four electro-mechanical transducers ($T_1 \ldots T_4$) and the pair of electrodes 3-4, it is possible to have variations of this first writing mode still using two auxiliary pulsatory waves but applied at different inputs.

For example, in a first variation, three surface waves may be used. As previously, signals U(t) and W(t) are applied respectively to transducers $T_1$ and $T_2$ but the signal S(t) is no longer applied to the electrodes 3-4 but to transductor $T_3$, and this with the same selection rules (4) and (5), i.e. $\omega_s = \omega_u \pm \omega_w$. Similarly, at a time t, the three signals which are now surface waves are present at a point M such that:

$$M \begin{cases} x = v_x t \\ y = v_y t - v_y \tau \end{cases}$$

The quantity of charges stored is then in the form according to formula (3):

$$q(x,y) \alpha\ U + W + S\left(\frac{x}{2v_x}\right) \cdot \cos\vec{K} \cdot \vec{r}$$

In relation to the preceding case, the change of sign S and the compression by two of the stored signals should be noted. As previously, signal S(t) is written, when t varies, on a line L of equation $$y = \frac{v_y}{v_x} \cdot x - v_y \tau.$$

On this line L, the signal is stored with a spatial periodicity $\vec{K}$ having components:

$$\frac{\omega_u \pm \omega_s}{v_x}\ \text{and}\ \pm \frac{\omega_w}{v_y}$$

A second variation consists in applying signal S(t) to an electro-mechanical transducer, for example $T_1$, and in applying one of the pulsatory writing signals, for example W(t), to electrodes 3 and 4, the other writing signal being applied to an electro-mechanical transducer, for example $T_2$, W(t) being as previously of the form:

$$W(t) = W \cdot \delta(t - \tau)$$

The three waves are only simultaneously present at time $t = \tau$ and this on the straight line of equation $y = v_y \cdot \tau$ which is now a horizontal straight line. The charge stored is then:

$$Q(x) \alpha\ U + W + S\left(-\frac{x}{v_x}\right) \cdot \cos\vec{K} \cdot \vec{r}$$

of spatial periodicity $$\vec{K} \frac{-\omega_s}{v_x}$$
$$\frac{\omega_w}{v_y}$$

At the end of writing, the charge Q(x) is memorized in the storage medium which is formed, as was mentioned above, for example by surface traps in a semiconductor, by a capacity network or by capacitances internal to the network of diodes which form the non-linear medium. In this latter case, the diodes are reverse-biassed at the end of writing; since their reverse current is small, the charges which have accumulated therein only disappear very slowly: by way of example, it is possible to reach with PN type diodes periods of storage of the order of 10 seconds at ambient temperature. There is then in the storage medium, during the whole duration of this storage, a frozen wave: $S_M - S(x,y) \cdot \cos\vec{K} \cdot \vec{r}$ plus a biassing potential equal to U+W.

In a first embodiment, the reading is carried out by non-linear interaction between the frozen wave $S_M$ and two auxiliary reading waves N(t) and P(t), similarly to the writing procedure: it uses the term $I_{NL3}$ of equation (2) above:

$$i_{NL3} = \frac{\partial^2 Y_{sc}}{\partial V_s} \cdot V^3 \alpha\ C \cdot V^3$$

The wave $S_L$ produced by reading has, as previously, for angular frequency $$\omega_L = \epsilon_N \omega_N + \epsilon_P \cdot \omega_P \quad (7)$$
where $\epsilon_N = \pm 1$ and $\epsilon_P = \pm 1$ $$\text{and as wave number } \vec{K_L} = \epsilon_N \vec{k_N} + \epsilon_P \vec{k_P} \pm \vec{K} \quad (8)$$

As during the writing, there exists here a selection rule, which now relates to the wave vectors:

if the reading signal $S_L$ is to be collected between electrodes 3 and 4, the wave vectors must be such that $K_L$ is zero or corresponds to the pitch of the signal electrode 3 if this latter is periodic, i.e. that $|\vec{K_L}| = 2\pi/p$ where p is the periodicity of the signal electrode, $K_L$ being perpendicular to the network formed by the signal electrode;

if the reading signal $S_L$ is to be collected by one of the transducers $T_1 \ldots T_4$, there must be emission of an elastic wave, which imposes moreover:

$$|\vec{K_L}| = |\vec{k_N} + \epsilon_p \vec{k_p} \pm \vec{K}| = \left|\frac{\omega_N + \epsilon_p \cdot \omega_p}{v}\right|,$$

where $v = v_x$ or $v_y$. By way of example, three possible reading modes are given below.

In a first variation, the auxiliary reading signals N(t) and P(t) are applied respectively to transducers $T_1$ and $T_2$:

$$N(t) = N\delta(t)e^{i\omega_N t} \text{ to } T_1$$

$$P(t) = P\delta(t - \tau)e^{i\omega_P t} \text{ to } T_2$$

The signal $S_L$ resulting from the non-linear interaction is then taken between electrodes 3 and 4; this signal is of the form:

$$S_L = e^{i(\omega_N + \epsilon_p \omega_p)t} \int \int S(x,y) \cdot \delta\left(t - \frac{x}{V_x}\right) \cdot$$

$$\delta\left(t - \tau - \frac{y}{V_y}\right) \cdot dx \cdot dy$$

that is to say that:

$$S_L \alpha S[v_x t, v_y(t - \tau)].$$

In other terms, as during writing, the point of interaction of the three waves sweeps along a diagonal line of equation:

$$y = \frac{v_y}{v_x} \cdot x - v_y \tau$$

Similarly, by changing the value of delay $\tau$, another line, parallel to the preceding one, is read.

It is to be noted that if the writing has been effected according to the first embodiment described, the selection rule (7) is automatically respected if $\omega_u = \omega_N$ and if $\omega_w = \omega_P$ and if $\omega_L = \omega_N \pm \omega_P$.

In a second variation, the same signal N(t) may be applied to transducer $T_1$, the same signal P(t) to transducer $T_4$: the reading signal $S_L$ will then be available at the terminals of electrodes 3 and 4. Similarly, the point of interaction of the three waves then sweeps along a diagonal line of equation:

$$y = -\frac{v_y}{v_x} \cdot x - v_y \cdot \tau.$$

In the case where the writing has been effected according to the first embodiment described above, this second reading mode enables lines and columns of the matrix stored during reading to be reversed, understanding by lines the information stored parallel to the preceding line (L).

According to a third reading variation, it is possible to apply the signal N(t) to transducer $T_1$, signal P(t) to transducer $T_3$; the reading signal $S_L$ is then collected at the terminals of transducer $T_1$. At a time t, a coordinate point M $$M \begin{cases} x = v_x t \\ y = v_y t - v_y \tau \end{cases}$$

emits an elastic wave proportional to $S(x,y) = S(v_x t, v_y t - v_y \tau)$ on condition that we have, according to formula (8) above:

$$\vec{K_L}\left\{-\frac{\omega_N + \epsilon_p \omega_p}{v_x}\right.$$

this condition is automatically respected if the writing has been carried out according to the first variation described above, in which signal U(t) is applied to transducer $T_1$, signal W(t) to $T_2$ and signal S(t) to transducer $T_3$; we then have $\omega_N = \omega_u$ and $\omega_p = \omega_w$, the output signal being collected at angular frequency $\omega_L L = \omega_N + \epsilon_p \omega_P$. It is to be noted that the signal $S_L$ collected is widened by a factor 2 in relation to stored signal $S_M$, which furthermore restores input signal S(t).

Thus has been described, in a first embodiment of the device of the invention, a process for writing a signal S(t) using two auxiliary pulsatory addressing waves, then a reading procedure also using two auxiliary pulsatory reading waves. Thus storage then restitution of the signal S(t) is obtained. In a second embodiment of the device of the invention, it is possible to obtain, after storage of the input signal S(t), a total transform thereof, such as its Fourier transform.

In a first variation, the previously stored signal $S_M = S(x,y) \cos \vec{K} \cdot \vec{r}$ is considered and the two following reading signals are used:

$N(t) = N \cdot e^{i\omega_N t}$ applied to transducer $T_1$, and $P(t) = P \cdot e^{i\omega_p t}$ applied to transducer $T_2$. These are not longer pulsatory signals, but long signals, i.e. whose duration is at least equal to the time taken by an elastic wave, of constant amplitude, which may for example be equal to unity, to sweep over the interaction surface. The output signal $S_L$ is as previously and with the same selection rules, for example collected between electrodes 3 and 4:

$$S_L \alpha e^{i(\omega_N + \omega_p)t} \cdot \int \int S(x,y) \cdot e^{i(\vec{k}_N \pm \vec{k}_p \pm \vec{K}) \cdot \vec{r}} d^2 r$$

It is a point of the bidimensional Fourier transform of signal S(x,y). To obtain another point of this transform, it is sufficient to begin again the reading operation with different values for $\omega_N$ and $\omega_P$. Thus the sweeping of the whole Fourier transform space is obtained.

However, the electrical signal available between electrodes 3 and 4 only represents useful information when the elastic waves cover the whole interaction zone: it must then of course only be taken at that moment. There appears furthermore here another disadvantage of this reading mode: in order to process another point of the transform, it is necessary to wait until the reading waves have disappeared from the interaction surface and until new reading waves of different angular frequency occupy the whole of this surface, which is equal to the time taken by an elastic wave to travel over the whole interaction surface.

To palliate this defect, in a variation, the previously stored signal $S_M$ is again taken but four reading signals f, g, h and r are used, applied respectively to the four transducers $T_1 \ldots T_4$, which are frequency gradients, i.e. signals whose frequency varies lineally with time:

to $T_1: S_1 = e^{j\alpha_1 t^2} \cdot e^{j\omega_1 t}$ to $T_2: S_2 = e^{j\alpha_2(t-\theta)^2} \cdot e^{j\omega_2 t}$ to $T_3: S_3 = e^{-j\alpha'_1 t^2} \cdot e^{j\omega_1 t}$ to $T_4: S_4 = e^{-j\alpha'_2(t-\theta)^2} \cdot e^{j\omega_2 t}$ $\alpha_1, \alpha'_1, \alpha_2$ and $\alpha'_2$ being coefficients of proportionality.

The interaction of these waves produces non-linear effects among which are considered those of the fourth order, as described in the French patent application No. 78-26817 in the name of Thomson-CSF. In this application, it is in particular shown that this interaction gives rise to a signal ($S_L$) of angular frequency $2(\omega_1 + \omega_2)$ and of a zero wave number, which it is possible to collect between electrodes 3 and 4, an output filter centered on frequency $(\omega_1 + \omega_2)/\pi$ enabling the useful signal to be isolated. The output signal $S_L$ corresponding to the whole interaction zone ABCD is then written, if we choose $\alpha_1 = \alpha_1'$ and $\alpha_2 = \alpha_2'$ $$S_L = e^{2j(\omega_1+\omega_2)t} \cdot \iint_{ABCD} S(x,y) \cdot \exp\left\{-4j\left(\frac{\alpha_1'}{v_x}x, \frac{\alpha_2(t-\theta)}{v_y}y\right)\right\} \cdot dx \cdot dy$$

If we designate by $K_1$ the quantity $4(\alpha_1 t/v_x)$ and by $K_2$ the quantity $(4\alpha_2/v_y)(t-\theta)$, it can be seen that the expression under the integral is the Fourier transform of the signal S:

$$J(K_1,K_2) = \iint_{ABCD} S(x,y) \cdot e^{-j(K_1 x + K_2 y)} dx \cdot dy \text{ and hence}$$

$$S_L = \exp\{2j(\omega_1 + \omega_2)t\} \cdot J\left[\frac{4\alpha_1 t}{v_x} x, \frac{4\alpha_2(t-\theta)}{v_y} y\right]$$

Thus we obtain, similarly to the first embodiment but in the Fourier transform space, sweeping along a line at a speed tied to $\alpha_1$ and $\alpha_2$; a frame of N parallel lines is obtained as previously by effecting N successive sweeps, either with N different values for the delay $\theta$, or with N different values for the frequencies of the signals.

In relation to the above-described variation, the rapidity of reading is greatly increased. In fact, it is no longer necessary to wait for time T mentioned above in order to read a second point of the Fourier transform: a time 1/B, where B is the pass band of the system, is here sufficient; that means that the reading is B.T times more rapid, BT being moreover equal to the number of independent resolvable points of a line of the image.

Another advantage of this second variation comes from the fact that the slope of the sweep line depends coefficients $\alpha_1$ and $\alpha_2$, and more precisely on the ratio $\alpha_1/\alpha_2$. It is then possible to achieve electronically any rotation of the image by the choice of the ratio $\alpha_1/\alpha_2$.

When it is desired not to cause the image to rotate, $\alpha_1$ is chosen fairly high and $\alpha_2$ low so that the frequencies of signals $S_2$ and $S_4$, which depend on $\alpha_2$, may be considered as constant during the time for sweeping the line.

This variation which uses four frequency gradients for reading presents however the disadvantage of using a non-linear interaction of the fourth order. According to a third variation, so as to be able to use a non-linear interaction of the third order only, the writing phase of signal S(t) is modified by previously modifying this latter by means of a frequency gradient.

In this case, since the signal to be stored is still assumed as being carried by a wave of angular frequency $\omega_s$, the signal applied to one of the inputs of the device is of the form:

$$S_1 = S(t) \cdot e^{i\omega_s t + i\alpha t^2}$$

$\alpha$ being a coefficient of proportionality.

Any one of the writing variations described above may be used. By way of example, it is supposed that:
the signal $S_1 = S(t) e^{i\alpha t^2} + i\omega_s t$ is applied to transducer $T_1$;
the signal $U \cdot \delta(t) \cdot e^{i\omega_u t}$ is applied to transducer $T_2$ and the signal $W \cdot \delta(t-\tau) \cdot e^{i\omega_w t}$ is applied to electrodes 3-4.

The signal stored on the line of equation $y = v_y \tau$, is then of the form: $S(-x/v_x, \tau) e^{i\alpha(x/v_x)^2}$, according to formula (3) and neglecting the biasing potential.

The signals are written as previously in lines parallel to the preceding one by causing the delay $\tau$ of W in relation to U to vary; the signal $S_M$ stored over the whole of the interaction surface is written:

$$S_M = S\left(-\frac{x}{v_x}, -\frac{y}{v_y}\right) \cdot e^{i\alpha(\frac{x}{v_x})^2} \cdot \cos\vec{K} \cdot \vec{r}$$

During reading, as previously two long auxiliary signals N(t) and P(t) are used one of which is also modulated linearly in frequency, with the same coefficient $\alpha$. There is for example applied:
to transducer $T_1$, the signal $N \cdot e^{i\omega_N t + i\alpha t^2}$
to transducer $T_2$, the signal $P \cdot e^{i\omega_P t}$ Output signal $S_L$ is then collected between the electrodes 3 and 4. The calculation shows that, at time t, the signal $S_L(t)$ is of the form:

$$S_L(t) = e^{i(\omega_N + \omega_P)t + i\alpha t^2} \cdot \iint S(x,y) \cdot e^{-2i\alpha t \frac{x}{v_x} - i\frac{\omega_P - \omega_u}{v_y} \cdot y} dx \cdot dy$$

if $\omega_P = \omega_S$.

It concerns a line $k_y = (\omega_p - \omega_u)/v_y$ of the two-dimensional Fourier transform of S(x,y).

According to a fourth variation, for the reading phase an interaction of the second order only may be used, similarly to what has just been described. For that, two of the three signals used for writing, for example S(t) and U(t), are modulated linearly in frequency. Reading is then accomplished, as previously, by means of two long signals N(t) and P(t), but both modulated linearly in frequency, with the sme coefficients as those which were used for writing.

By way of example, a device according to the invention has been constructed in which DIRAC pulses were used having a duration of 30 ns, carrier waves of a frequency of 100 MHz for U, 150 MHz for W and 250 MHz for the signal S(t) if we take as selection rule (4) the sum mode, i.e. $\omega_s = \omega_u + \omega_w$; if we choose the difference mode, i.e. $\omega_s = \omega_u - \omega_w$, the frequencies are then, for U: 250 MHz and for W: 100 MHz, which gives 150 MHz for S. The dimensions of the zone 5 of intersection of the waves (in FIG. 2) are 100 micron $\times$ 100 micron, which leads for an interaction zone of 1 cm $\times$ 1 cm to $10^4$ storage points.

What is claimed is:

1. A two dimensional acousto-electric device for storing and processing an analog input signal comprising:
   a piezoelectric medium, carrying at least two electromechanical transducers capable of generating elastic waves at the surface of said piezoelectric medium in at least two separate directions;
   an electrically non linear medium in which non linear interactions are apt to occur between electrical fields associated with said elastic waves;
   a medium for storing electric charges, said medium being electrically coupled to said non linear medium;
   the storage of said analog input signal being achieved by means of at least two auxiliary writing signals, at least two of these three signals, i.e. the analog input signal and the writing signals, being applied to said electro-mechanical transducers, and the third being applied to the device, the frequencies of said auxiliary signals being such that the non linear interaction of the three signals supplies a fourth signal, representing the input signal, independent of time, in the form of a periodic spatial distribution of electric charges stored in said storage medium.

2. A device as claimed in claim 1, wherein said two separate directions are normal to each other.

3. A device as claimed in claim 1, wherein said auxiliary writing signals have a pulsatory form and an amplitude greater than the amplitude of said input signal, the surface of intersection of said auxiliary writing signals defining an elementary interaction zone, said auxiliary writing signals being generated with a period at least equal to the time required by the elementary zone to sweep said interaction surface, and relative variable delays ensuring that the interaction surface is swept in lines by the elementary zone, said fourth signal being stored in lines.

4. A device as claimed in claim 3, further comprising terminals in the form of two continuous electrodes respectively coupled to said piezoelectric medium and said non linear medium, and wherein said two auxiliary writing signals are applied respectively to said two electro-mechanical transducers and said input signal is applied to said continuous electrodes.

5. A device as claimed in claim 3, wherein there is further provided a third electro-mechanical transducer generating elastic waves at the surface of said piezoelectric medium in the same direction as one of said two transducers, said two auxiliary writing signals being applied respectively to said two transducers and said input signal being applied to said third transducer.

6. A device as claimed in claim 3, further comprising terminals in the form of two continuous electrodes respectively coupled to said piezoelectric medium and said non linear medium, and wherein one of said auxiliary writing signals is applied to said terminals, and the other of said writing signals and the input signal are applied respectively to said two electro-mechanical transducers.

7. A device as claimed in claim 1, further comprising picking means for picking up an output signal, wherein the reading of said stored signal is achieved by means of two auxiliary pulsatory reading waves, whose frequencies are such that the non linear interaction of said stored signal and of said two auxiliary reading waves supplies an output signal whose wave number corresponds to the perodicity of said picking means.

8. A device as claimed in claim 7, further comprising terminals in the form of two continuous electrodes respectively coupled to said piezoelectric medium and said non linear medium, and wherein said two auxiliary reading waves are applied respectively to said two electro-mechanical transducers, said output signal being picked up between said terminals.

9. A device as claimed in claim 7, wherein a third electro-mechanical transducer is provided generating elastic waves at the surface of the piezoelectric medium in the same direction as a first of said two transducers, said two auxiliary reading waves being applied respectively to the first and to the third transducers, and said output signal being picked up from said first transducer.

10. A device as claimed in claim 7, further comprising a fourth electro-mechanical transducer, generating elastic waves at the surface of said piezoelectric medium in the same direction as a second of said two transducers, said two auxiliary reading waves being applied respectively to said first and fourth transducers, said picking means comprising two electrodes respectively coupled to said piezoelectric medium and said non linear medium.

11. A device as claimed in claim 1, wherein the reading of said stored signal is achieved by means of two long auxiliary reading waves whose duration is at least equal to the time taken by an elastic wave to sweep said interaction surface, the interaction of these three signals supplying a point of the Fourier transform of said input signal, the other points of the transform being supplied by the variation of the frequencies of said auxiliary reading waves.

12. A device as claimed in claim 1, wherein the reading of said stored signal is achieved by means of four auxiliary reading waves modulated linearly in frequency, and emitted in two separate directions at the surface of said piezoelectric medium, the waves emitted in the same direction having the same frequency and opposite modulation slopes, wave trains being emitted in the second direction with a delay or a frequency shift varying in relation to the wave trains emitted in the first direction, the interaction of these wave trains supplying line after line the Fourier transform of the input signal.

13. A device as claimed in claim 1, wherein said input signal is linearly modulated in frequency before non linear interaction with said two auxiliary writing signals and wherein the reading of said stored signal is achieved by means of two auxiliary reading waves, the first reading wave being a long wave whose duration is at least equal to the time taken by an elastic wave to sweep said interaction surface, the second reading wave being a long wave whose duration is at least equal to the preceding one, linearly modulated in frequency, the interaction of these signals supplying an output signal which represents a line of the Fourier transform of said input signal.

14. A device as claimed in claim 1, wherein said input signal and one of said auxiliary writing signals are linearly modulated in frequency before non linear interaction with the other one of said auxiliary writing signals and wherein the reading of said stored signal is achieved by means of two auxiliary reading waves, linearly modulated in frequency, whose durations are at least equal to the time taken by an elastic wave to sweep said interaction surface, the interaction of these three signals supplying an output signal which represents a line of the Fourier transform of the input signal.

15. A device as claimed in claim 1, wherein said piezoelectric medium is formed by a first wafer and said non linear medium is formed by a second wafer made from a semi-conductor material, the two wafers being separated by a layer of air, said elastic waves being propagated on a first surface of the semi-conductor wafer, the electrical terminals of the device being formed by electrodes placed respectively on the outer faces of said two wafers.

16. A device as claimed in claim 15, wherein said electrodes are continuous.

17. A device as claimed in claim 15, wherein said storage medium is formed by said semi-conductor wafer.

18. A device as claimed in claim 15, wherein said non linear medium and said storage medium are formed by a same network of PN or Schottky diodes or MIS or MOS elements, formed in said semi-conductor wafer on the surface which is facing said piezoelectric wafer.

19. A device as claimed in claim 15, wherein said storage medium comprises a network of storage elements.

* * * * *